US012813264B2

(12) United States Patent
Tokumaru et al.

(10) Patent No.: US 12,813,264 B2
(45) Date of Patent: Nov. 24, 2026

(54) SEMICONDUCTOR DEVICE AND METHOD FOR MANUFACTURING THE SAME

(71) Applicant: Mitsubishi Electric Corporation, Tokyo (JP)

(72) Inventors: Shogo Tokumaru, Tokyo (JP); Yasuhiro Sakai, Tokyo (JP); Kenta Nakahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 329 days.

(21) Appl. No.: 18/724,460

(22) PCT Filed: May 2, 2022

(86) PCT No.: PCT/JP2022/019508
§ 371 (c)(1),
(2) Date: Jun. 26, 2024

(87) PCT Pub. No.: WO2023/214450
PCT Pub. Date: Nov. 9, 2023

(65) Prior Publication Data
US 2025/0069981 A1 Feb. 27, 2025

(51) Int. Cl.
*H10W 40/22* (2026.01)
*H10W 70/04* (2026.01)
(Continued)

(52) U.S. Cl.
CPC ....... *H10W 40/228* (2026.01); *H10W 70/041* (2026.01); *H10W 70/658* (2026.01); *H10W 70/685* (2026.01); *H10W 90/734* (2026.01)

(58) Field of Classification Search
CPC ............. H10W 40/228; H10W 70/041; H10W 70/658; H10W 70/685; H10W 90/734; H10W 90/00; H10W 40/255
See application file for complete search history.

(56) References Cited

U.S. PATENT DOCUMENTS 11,658,098 B2 * 5/2023 Talledo .................. H10P 54/00 257/676
2021/0134606 A1 * 5/2021 Liu ..................... H10W 40/255
(Continued)

FOREIGN PATENT DOCUMENTS

JP H09-252082 A 9/1997
JP 2006-140402 A 6/2006
JP 2009-188164 A 8/2009

OTHER PUBLICATIONS

International Search Report issued in PCT/JP2022/019508; mailed Jul. 19, 2022.

*Primary Examiner* — Yasser A Abdelaziez
(74) *Attorney, Agent, or Firm* — Studebaker Brackett PLLC

(57) ABSTRACT

A groove (6) is provided on an upper surface of a heat sink (5) along an outer periphery of an insulating substrate (1). A first solder joint material (7) is filled in the groove (6). A second solder joint material (8) is provided on the upper surface of the heat sink (5) and the first solder joint material (7) and joins the upper surface of the heat sink (5) and the first metal pattern (1*b*). The first solder joint material (7) and the second solder joint material (8) are of different types. A melting point of the first solder joint material (7) filled in the groove (6) is lower than a melting point of the second solder joint material (8).

7 Claims, 3 Drawing Sheets

(51) Int. Cl.

| | |
|---|---|
| ***H10W 70/65*** | (2026.01) |
| ***H10W 70/685*** | (2026.01) |
| *H10W 90/00* | (2026.01) |

(56) References Cited

U.S. PATENT DOCUMENTS

2023/0060577 A1* 3/2023 Akai ........................ H01B 1/22
2023/0076271 A1* 3/2023 Sugai ................. H10H 20/8506
2023/0094926 A1* 3/2023 Meyer .................. H05K 1/0203
174/260

* cited by examiner

SEMICONDUCTOR DEVICE AND METHOD FOR MANUFACTURING THE SAME

FIELD

The present disclosure relates to a semiconductor device and a method for manufacturing the same.

BACKGROUND

In a semiconductor power module, a solder joint material is used when an insulating substrate is joined onto a heat sink. In order to improve the thermal fatigue resistance of a solder joint material, it has been proposed to provide a groove in a heat sink along the outer peripheral portion of an insulating substrate (for example, see PTL 1).

CITATION LIST

Patent Literature

[PTL 1] JP H9-252082A

SUMMARY

Technical Problem

Filling the groove with the solder joint material can increase the thickness of the solder joint material on the outer peripheral portion of the insulating substrate. This can prevent crack occurrence in the solder joint material due to: heat stress generated in operation of the semiconductor device; and stress on the insulating substrate and semiconductor chip. However, there has been a problem of solder voids occurring in the grooves and reducing the reliability of the semiconductor device.

The present disclosure has been made to solve the above-mentioned problems, and an object thereof is to obtain a semiconductor device and a method for manufacturing the same, capable of improving reliability.

Solution to Problem

A semiconductor device according to the present disclosure includes: an insulating substrate including an insulating layer, a first metal pattern provided on a lower surface of the insulating layer, and a second metal pattern provided on an upper surface of the insulating layer; a semiconductor chip joined to the second metal pattern; a heat sink provided below the insulating substrate and having an upper surface on which a groove is provided along an outer periphery of the insulating substrate; a first solder joint material filled in the groove; and a second solder joint material provided on the upper surface of the heat sink and the first solder joint material and joining the upper surface of the heat sink and the first metal pattern, wherein the first solder joint material and the second solder joint material are of different types, and a melting point of the first solder joint material is lower than a melting point of the second solder joint material.

Advantageous Effects of Invention

In the present disclosure, the first solder joint material and the second solder joint material are of different types, and the melting point of the first solder joint material, with which the groove is filled, is made lower than the melting point of the second solder joint material. Therefore, since the first solder joint material first melts in reflow, the air bubbles in the first solder joint material move upward from the groove due to pressure from above. As a result, solder voids inside the groove are reduced, so that reliability can be improved.

DESCRIPTION OF EMBODIMENTS

Figure 1:
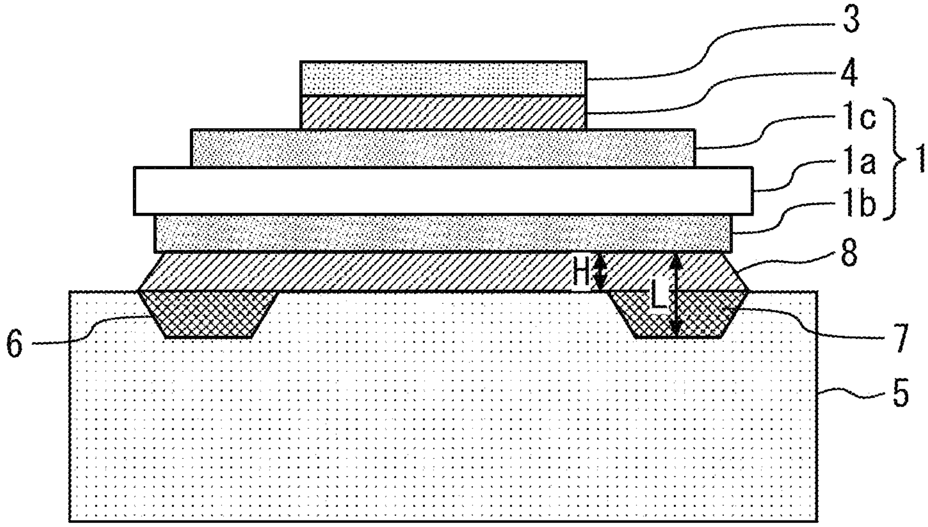
FIG. 1 is a sectional view showing a semiconductor device according to an embodiment.
Figure 2:
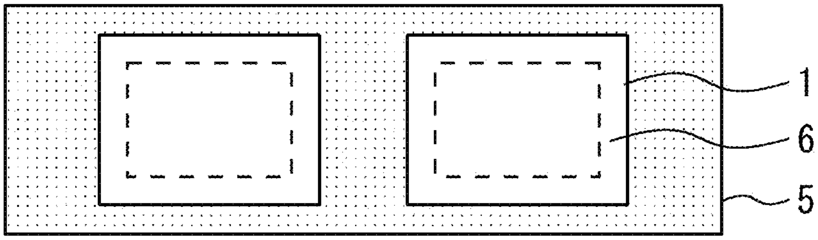
FIG. 2 is a plan view showing a heat sink and insulating substrates according to the embodiment.

FIG. 1 is a sectional view showing a semiconductor device according to an embodiment. FIG. 2 is a plan view showing a heat sink and insulating substrates according to the embodiment. The insulating substrates 1 each include an insulating layer 1*a*, a first metal pattern 1*b* provided on the lower surface of the insulating layer 1*a*, and a second metal pattern 1*c* provided on the upper surface of the insulating layer 1*a*. A semiconductor chip 3 is joined to a second metal pattern 1*c* of an insulating substrate 1 with a solder joint material 4. A heat sink 5 is provided below the insulating substrate 1. The material of the heat sink 5 is, for example, copper.

A groove 6 is provided on the upper surface of the heat sink 5 along the outer periphery of each insulating substrate 1. The insulating substrate 1 is square in plan view, and the groove 6 is square frame-shaped. The inner periphery of the groove 6 is inside the outer periphery of the insulating substrate 1 in plan view, and the outer periphery of the groove 6 is coincident with the outer periphery of the insulating substrate 1 or outside it.

The groove 6 is filled with a first solder joint material 7. A second solder joint material 8 is provided on the upper surface of the heat sink 5 and the first solder joint material 7, and joins the upper surface of the heat sink 5 and the first metal pattern 1*b*.

Filling the groove 6 with the first solder joint material 7 can increase the thickness of the solder joint material on the outer peripheral portion of the insulating substrate 1. This can prevent crack occurrence in the solder joint material due to: heat stress generated in operation of the semiconductor device; and stress on the insulating substrate 1 and the semiconductor chip 3.

$L>2H$ is satisfied, where: H is the distance between the upper surface of the heat sink 5 and the first metal pattern 1*b*; and L is the distance between the bottom surface of the groove 6 and the first metal pattern 1*b*. This makes the thickness of the solder joint material on the outer periphery of the insulating substrate 1 twice that of the conventional one, thus making it possible to lighten stress and prevent crack occurrence. Furthermore, the thickness of the solder joint material underneath the semiconductor chip 3 is the same as that of the conventional one, so that the heat dissipation performance does not reduce.

Figure 3:
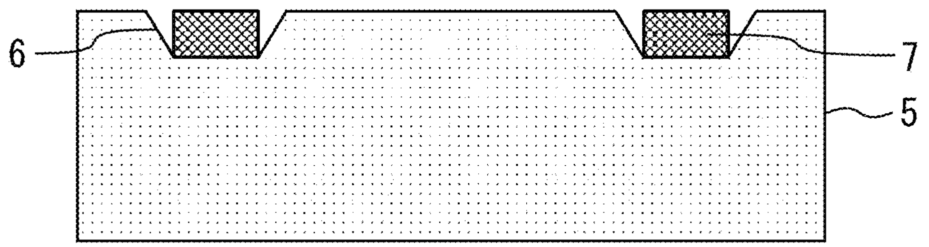
FIG. 3 is a sectional view showing a method for manufacturing a semiconductor device according to the embodiment.
Figure 4:
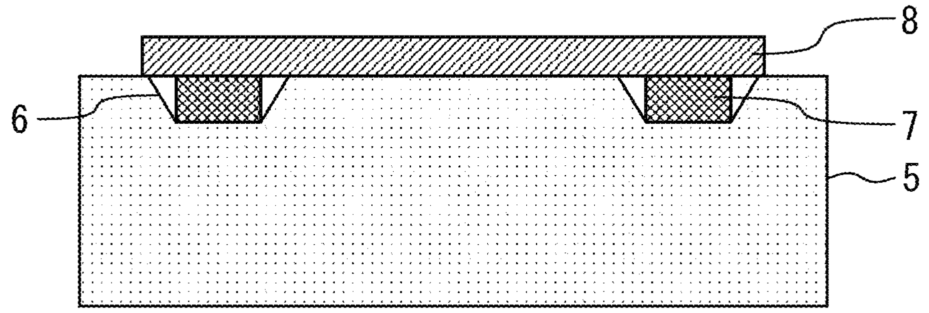
FIG. 4 is a sectional view showing a method for manufacturing a semiconductor device according to the embodiment.

Next, a method for manufacturing a semiconductor device according to an embodiment will be described. FIGS. 3 and 4 are sectional views showing a method for manufacturing a semiconductor device according to the embodiment. As shown in FIG. 3, cut solder as the first solder joint material 7 is placed along the groove 6 provided on the upper surface of the heat sink 5. Next, as shown in FIG. 4, cut solder as the second solder joint material 8 is placed on the upper surface of the heat sink 5 and the first solder joint material 7. Next, the insulating substrate 1 is placed on the second solder joint material 8 so that the groove 6 is arranged along the outer periphery of the insulating substrate 1, and the first solder joint material 7 and the second solder joint material 8 are reflowed to join the upper surface of the heat sink 5 and the first metal pattern 1*b*. Next, the semiconductor chip 3 is joined to the second metal pattern 1*c*. The semiconductor device according to the embodiment is manufactured through the above steps.

Figure 5:
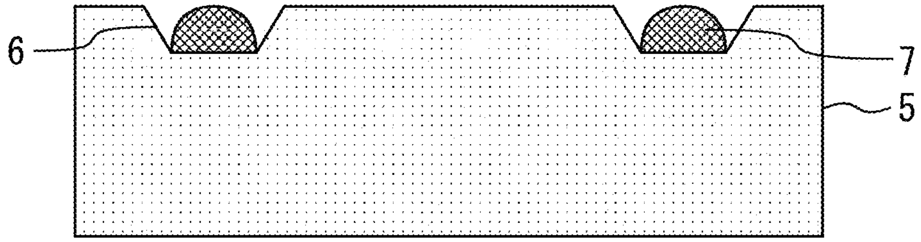
FIG. 5 is a sectional view showing a modification of the method for manufacturing a semiconductor device according to the embodiment.
Figure 6:
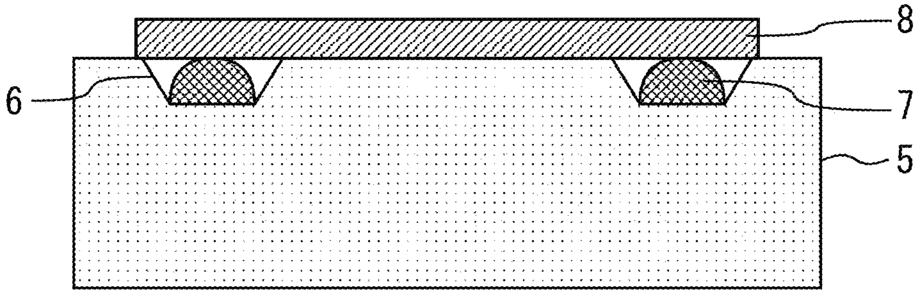
FIG. 6 is a sectional view showing a modification of the method for manufacturing a semiconductor device according to the embodiment.

FIGS. 5 and 6 are sectional views showing a modification of the method for manufacturing a semiconductor device according to the embodiment. As shown in FIG. 5, paste solder as the first solder joint material 7 is applied along the groove 6. Next, as shown in FIG. 6, cut solder as the second solder joint material 8 is placed on the upper surface of the heat sink 5 and the first solder joint material 7. The subsequent steps are the same as the above. Arranging the first solder joint material 7 in the groove 6 first and then placing the second solder joint material 8 in this way makes it possible to mount solder joint materials made of different materials.

In the present embodiment, the first solder joint material 7 and the second solder joint material 8 are of different types, and the melting point of the first solder joint material 7, with which the groove 6 is filled, is made lower than the melting point of the second solder joint material 8. Therefore, since the first solder joint material 7 first melts in reflow, the air bubbles in the first solder joint material 7 move upward from the groove 6 due to pressure from above. As a result, solder voids inside the groove 6 are reduced, so that reliability can be improved. Note that the voids in the second solder joint material 8 on the heat sink 5 can be confirmed on the surface even after reflow, and therefore can be corrected by rework from outside.

The semiconductor chip 3 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

REFERENCE SIGNS LIST

1 insulating substrate; 1*a* insulating layer; 1*b* first metal pattern; 1*c* second metal pattern; 3 semiconductor chip; 5 heat sink; 6 groove; 7 first solder joint material; 8 second solder joint material

The invention claimed is:

1. A semiconductor device comprising:

an insulating substrate including an insulating layer, a first metal pattern provided on a lower surface of the insulating layer, and a second metal pattern provided on an upper surface of the insulating layer;

a semiconductor chip joined to the second metal pattern;

a heat sink provided below the insulating substrate and having an upper surface on which a groove is provided along an outer periphery of the insulating substrate;

a first solder joint material filled in the groove; and a second solder joint material provided on the upper surface of the heat sink and the first solder joint material and joining the upper surface of the heat sink and the first metal pattern, wherein the first solder joint material and the second solder joint material are of different types, and a melting point of the first solder joint material is lower than a melting point of the second solder joint material.

2. The semiconductor device according to claim 1, wherein L>2H is satisfied, where H is a distance between the upper surface of the heat sink and the first metal pattern, and L is a distance between a bottom surface of the groove and the first metal pattern.

3. The semiconductor device according to claim 1, wherein the semiconductor chip is made of a wide-band-gap semiconductor.

4. A method for manufacturing a semiconductor device comprising:

placing a first solder joint material along a groove provided on an upper surface of the heat sink;

placing a second solder joint material on the upper surface of the heat sink and the first solder joint material;

placing an insulating substrate on the second solder joint material so that the groove is arranged along an outer periphery of the insulating substrate wherein the insulating substrate includes an insulating layer, a first metal pattern provided on a lower surface of the insulating layer, and a second metal pattern provided on an upper surface of the insulating layer, and reflowing the first solder joint material and the second solder joint material to join the upper surface of the heat sink and the first metal pattern; and joining a semiconductor chip to the second metal pattern, wherein the first solder joint material and the second solder joint material are of different types, and a melting point of the first solder joint material is lower than a melting point of the second solder joint material.

5. The method for manufacturing a semiconductor device according to claim 4, wherein cut solder as the first solder joint material is placed along the groove.

6. The method for manufacturing a semiconductor device according to claim 4, wherein paste solder as the first solder joint material is applied along the groove.

7. The semiconductor device according to claim 2, wherein the semiconductor chip is made of a wide-band-gap semiconductor.

* * * * *